(12) United States Patent
Kang

(10) Patent No.: US 12,549,183 B2
(45) Date of Patent: Feb. 10, 2026

(54) LEVEL SHIFTER

(71) Applicant: SK hynix Inc., Icheon-si (KR)

(72) Inventor: Ji Hyo Kang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 107 days.

(21) Appl. No.: 18/519,308

(22) Filed: Nov. 27, 2023

(65) Prior Publication Data

US 2025/0015803 A1     Jan. 9, 2025

(30) Foreign Application Priority Data

Jul. 6, 2023   (KR) .......................... 10-2023-0087658

(51) Int. Cl.
  *H03K 19/0175* (2006.01)
  *H03K 5/00* (2006.01)
  *H03K 5/01* (2006.01)

(52) U.S. Cl.
  CPC ....... *H03K 19/017509* (2013.01); *H03K 5/01* (2013.01); *H03K 2005/00078* (2013.01)

(58) Field of Classification Search
  CPC ............. H03K 19/017509; H03K 5/01; H03K 2005/00078; H03K 5/003
  See application file for complete search history.

(56) References Cited

U.S. PATENT DOCUMENTS 8,253,441 B1   8/2012  Roo et al.
8,610,510 B2 * 12/2013  Kim ....................... H03K 3/017
                                                                  331/34
2008/0309395 A1 * 12/2008  Kaneko ............ H03K 19/01831
                                                                 327/333

FOREIGN PATENT DOCUMENTS

CN       108768145 A   * 11/2018  ............ H02M 1/088
KR       101020280 B1    3/2011
WO   WO-2013089698 A1 *  6/2013  ..... H03K 19/017509

* cited by examiner

*Primary Examiner* — Lincoln D Donovan
*Assistant Examiner* — James G Yeaman
(74) *Attorney, Agent, or Firm* — WILLIAM PARK AND ASSOCIATES LTD.

(57) ABSTRACT

A level shifter includes a first buffer circuit, a first capacitor, a second capacitor, a cross-coupled inverter, and a second buffer circuit. The first buffer circuit is configured to drive a first input signal and a second input signal with a first high power supply voltage and a first low power supply voltage to generate a first main driving signal and a second main driving signal. The first capacitor, the second capacitor, and the cross-coupled inverter are configured to generate signals of a first node and a second node based on the first and second main driving signals. The second buffer circuit is configured to drive the signals of the first and second nodes with a second high power supply voltage and a second low power supply voltage to generate a first output signal and a second output signal.

25 Claims, 8 Drawing Sheets

LEVEL SHIFTER

CROSS-REFERENCES TO RELATED APPLICATION

The present application claims priority under 35 U.S.C. § 119 (a) to Korean application number 10-2023-0087658 filed on Jul. 6, 2023, in the Korean Intellectual Property Office, which is incorporated herein by reference in its entirety.

BACKGROUND

1. Technical Field

Various embodiments generally relate to integrated circuit technology, and more particularly, to a level shifter capable of changing power domains.

2. Related Art

A semiconductor apparatus includes a plurality of circuits, and the plurality of circuits may operate by receiving different power supply voltages. When a signal is propagated through the plurality of circuits, it is necessary to convert the voltage level of the signal, and a level shifter is commonly used to convert the voltage level of the signal. For example, when a first circuit operates in the domain of a first power supply voltage and a second circuit operates in the domain of a second power supply voltage and a signal is provided from the first circuit to the second circuit, the level shifter may change the voltage level of the signal from the domain of the first power supply voltage to the domain of the second power supply voltage. Conversely, when a signal is provided from the second circuit to the first circuit, the level shifter may change the voltage level of the signal from the domain of the second power supply voltage to the domain of the first power supply voltage.

As the operating speed of a semiconductor system increases, the signal used in it may have higher frequency and smaller amplitude. Therefore, when the voltage level of the signal is converted through a conventional level shifter, a duty ratio error or phase skew may be introduced into the converted signal. The duty ratio distortion and phase skew may become more severe as the frequency of the signal input to the level shifter increases.

SUMMARY

In an embodiment, a level shifter may include a first buffer circuit, a first capacitor, a second capacitor, a cross-coupled inverter, and a second buffer circuit. The first buffer circuit may be configured to drive a first input signal and a second input signal with a first high power supply voltage and a first low power supply voltage to generate a first main driving signal and a second main driving signal, respectively, configured to change a voltage level of the second main driving signal based on the first input signal, and configured to change a voltage level of the first main driving signal based on the second input signal. The first capacitor may have a first end for receiving the first main driving signal and a second end being coupled with a first node. The second capacitor may have a first end for receiving the second main driving signal and a second end being coupled with a second node. The cross-coupled inverter may be configured to be coupled between the first and second nodes, and operable to receive a second high power supply voltage and a second low power supply voltage. The second buffer circuit may be configured to drive signals of the first and second nodes with the second high power supply voltage and the second low power supply voltage to generate a first output signal and a second output signal, respectively.

In an embodiment, a level shifter may include a first buffer circuit, a first capacitor, a second capacitor, a cross-coupled inverter, and a second buffer circuit. The first buffer circuit may be configured to drive a first input signal and a second input signal with a first high power supply voltage and a first low power supply voltage to generate a first main driving signal and a second main driving signal. The first capacitor may have a first end for receiving the first main driving signal and a second end being coupled to a first node. The second capacitor may have a first end for receiving the second main driving signal and a second end be coupled with a second node. The cross-coupled inverter may be configured to be coupled between the first and second nodes, and operable to receive a second high power supply voltage and a second low power supply voltage. The second buffer circuit may be configured to drive signals of the first and second nodes with the second high power supply voltage and the second low power supply voltage to generate a first output signal and a second output signal, respectively, configured to change a voltage level of the second output signal based on a signal of the first node, and configured to change a voltage level of the first output signal based on a signal of the second node.

In an embodiment, a level shifter may include a first buffer circuit, a first capacitor, a second capacitor, a cross-coupled inverter, and a second buffer circuit. The first buffer circuit may be configured to drive a first input signal and a second input signal with a first high power supply voltage and a first low power supply voltage to generate a first main driving signal and a second main driving signal, respectively, configured to provide a first auxiliary driving signal and a second auxiliary driving signal having a voltage level between a second high power supply voltage and a second low power supply voltage to a first node and a second node, respectively, in a first operation mode, and configured to drive the first and second input signals with the second high power supply voltage and the second low power supply voltage to generate the first and second auxiliary driving signals, respectively, in a second operation mode. The first capacitor may have a first end for receiving the first main driving signal and a second end being coupled with the first node. The second capacitor may have a first end for receiving the second main driving signal and a second end being coupled with the second node. The cross-coupled inverter may be configured to be coupled between the first and second nodes, and operable to receive the second high power supply voltage and the second low power supply voltage. The second buffer circuit may be configured to drive signals of the first and second nodes with the second high power supply voltage and the second low power supply voltage to generate a first output signal and a second output signal, respectively.

In an embodiment, a level shifter may include a first buffer circuit, a first capacitor, a second capacitor, a cross-coupled inverter, and a second buffer circuit. The first buffer circuit may be configured to drive a first input signal and a second input signal with a first high power supply voltage and a first low power supply voltage to generate a first main driving signal and a second main driving signal, respectively. The first capacitor may a first end for receiving the first main driving signal and a second end being coupled to a first node. The second capacitor may have a first end for receiving the second main driving signal and a second end being coupled with a second node. The cross-coupled inverter may be configured to be coupled between the first and second nodes, and operable to receive a second high power supply voltage and a second low power supply voltage. The second buffer circuit may be configured to drive signals of the first and second nodes with the second high power supply voltage and the second low power supply voltage to generate a first output signal and a second output signal, respectively, configured to form a first current path coupling the first output signal with the first node in a first operation mode and a second current path coupling the second output signal with the second node, and configured to open the first and second current paths in a second operation mode.

DETAILED DESCRIPTION

Various embodiments may provide a level shifter capable of converting a voltage level of an input signal from a first voltage domain to a second voltage domain. Some embodiments may provide a level shifter capable of generating an output signal by correcting a duty error and/or phase skew of the input signals and/or the output signal. Additional embodiments may improve the operational performance of a semiconductor apparatus comprising a level shifter by enabling stable voltage domain crossing of a signal by compensating for duty error and phase skew.

Figure 1:
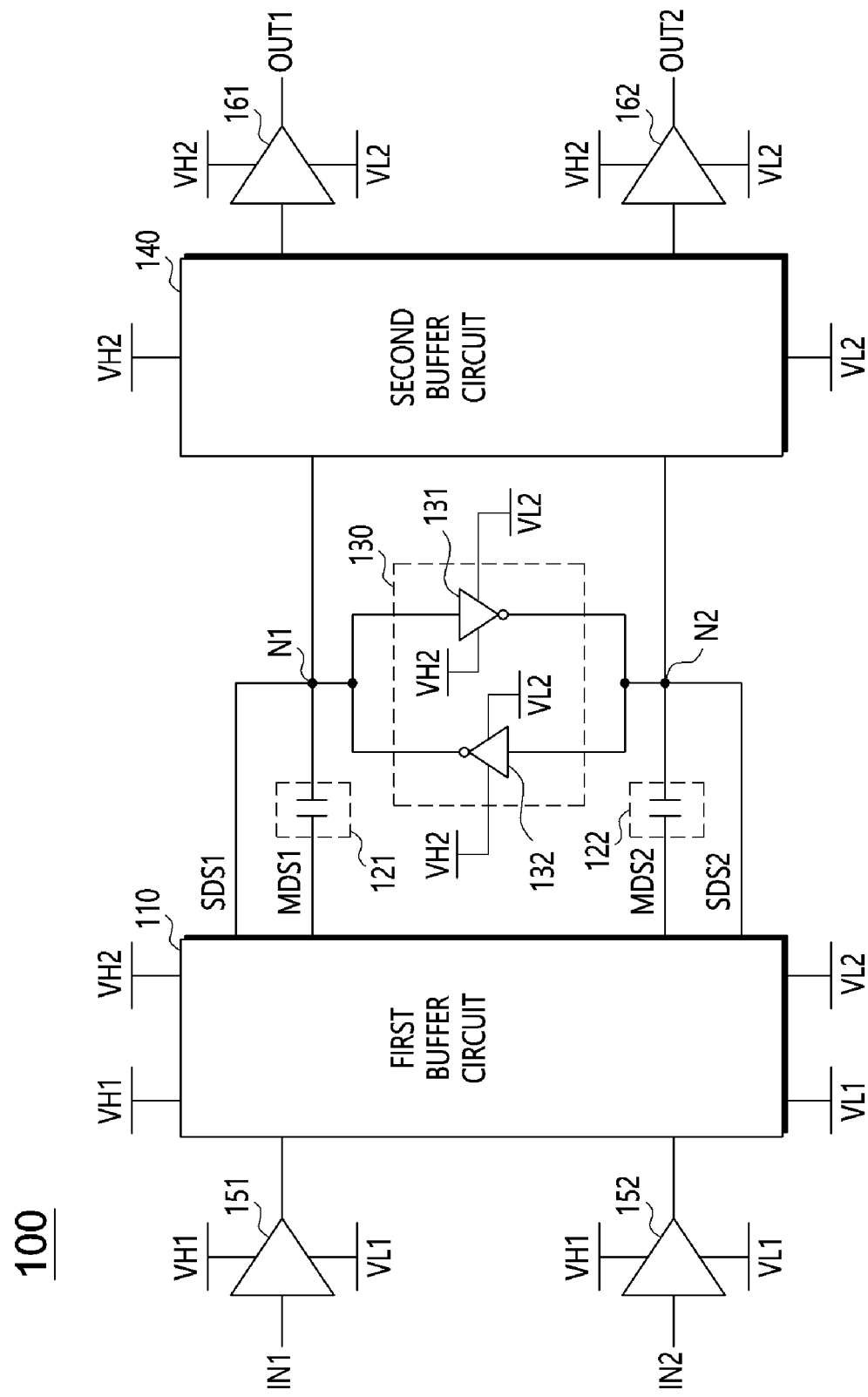
FIG. 1 is a diagram illustrating a configuration of a level shifter according to an embodiment.

FIG. 1 is a drawing illustrating a configuration of a level shifter 100 according to an embodiment. Referring to FIG. 1, the level shifter 100 may receive a first input signal IN1 and a second input signal IN2 to generate a first output signal and a second output signal OUT1, OUT2. The first and second input signals IN1, IN2 may be signals of a first voltage domain, and the first and second output signals OUT1, OUT2 may be signals of a second voltage domain. The level shifter 100 may convert the voltage domains of the first and second input signals IN1, IN2 from the first voltage domain to the second voltage domain to generate the first and second output signals OUT1, OUT2.

The first voltage domain may be defined as a voltage range between a first high power supply voltage VH1 and a first low power supply voltage VL1. The first high power supply voltage VH1 may have a higher voltage level than the first low power supply voltage VL1. The first and second input signals IN1, IN2 may have a voltage level between the first high power supply voltage VH1 and the first low power supply voltage VL1. The second voltage domain may be defined as a voltage range between the second high power supply voltage VH2 and the second low power supply voltage VL2. The second high power supply voltage VH2 may have a higher voltage level than the second low power supply voltage VL2.

The second high power supply voltage VH2 may have the same voltage level as the first high power supply voltage VH1 or may have a different voltage level. The second low power supply voltage VL2 may have the same voltage level as the first low power supply voltage VL1 or may have a different voltage level. When the second high power supply voltage VH2 has the same level as the first high power supply voltage VH1, the second low power supply voltage VL2 may have a voltage level different from the first low power supply voltage VL1 level. When the second low power supply voltage VL2 has the same voltage level as the first low power supply voltage VL1, the second high power supply voltage VH2 may have a different voltage level than the first high power supply voltage VH1.

The first and second output signals OUT1, OUT2 may have a voltage level between the second high power supply voltage VH2 and the second low power supply voltage VL2. The second input signal IN2 may be a complementary signal of the first input signal IN1. The second output signal OUT2 may be a complementary signal of the first output signal OUT1. The level shifter 100 may generate from the first and second input signals IN1, IN2 swinging to a voltage level between the first high power supply voltage VH1 and the first low power supply voltage VL1, the first and second output signals OUT1, OUT2 swinging to a voltage level between the second high power supply voltage VH2 and the second low power supply voltage VL2.

The level shifter 100 may include a first buffer circuit 110, a first capacitor 121, a second capacitor 122, a cross-coupled inverter 130, and a second buffer circuit 140. The first buffer circuit 110 may receive the first and second input signals IN1, IN2 and generate at least a first main driving signal MDS1 and a second main driving signal MDS2. The first buffer circuit 110 may operate by receiving at least the first high power supply voltage VH1 and the first low power supply voltage VL1. The first buffer circuit 110 may drive the first input signal IN1 with the first high power supply voltage VH1 and the first low power supply voltage VL1 to generate the first main driving signal MDS1. The first buffer circuit 110 may drive the second input signal IN2 with the first high power supply voltage VH1 and the first low power supply voltage VL1 to generate the second main driving signal MDS2.

The first buffer circuit 110 may compensate for a phase skew and/or duty error of the first and second input signals IN1, IN2 to generate the first and second main driving signals MDS1, MDS2. The phase skew may be a difference between a phase of the first input signal IN1 and a phase of the second input signal IN2. The duty error may be a difference between a duty ratio of the first input signal IN1 and a duty ratio of the second input signal IN2. To compensate for the phase skew and/or duty error, the first buffer circuit 110 may change the voltage level of the second main driving signal MDS2 based on the first input signal IN1, and may change the voltage level of the first main driving signal MDS1 based on the second input signal IN2. The first buffer circuit 110 may delay the first input signal IN1 and mix the phase of the delayed first input signal and the second main driving signal MDS2, thereby reducing a phase skew and/or duty error between the first input signal IN1 and the second input signal IN2. By delaying the second input signal IN2 and mixing the phase of the delayed second input signal and the first main driving signal MDS1, the first buffer circuit 110 may reduce the phase skew and/or duty error between the first input signal IN1 and the second input signal IN2.

A first end of the first capacitor 121 may receive the first main driving signal MDS1, and a second end of the first capacitor 121 may be coupled with the first node N1. The first capacitor 121 may carry an alternating current component of the first main driving signal MDS1 and not carry a direct current component of the first main driving signal MDS1. For example, the first capacitor 121 may change the first node N1 to a high logic level when the first main driving signal MDS1 transitions from a low logic level to a high logic level, and may change the first node N1 to a low logic level when the first main driving signal MDS1 transitions from a high logic level to a low logic level.

A first end of the second capacitor 122 may receive the second main driving signal MDS2, and a second end of the second capacitor 122 may be coupled with the second node N2. The second capacitor 122 may carry an alternating current component of the second main driving signal MDS2 and not carry a direct current component of the second main driving signal MDS2. For example, the second capacitor 122 may change the second node N2 to a high logic level when the second main driving signal MDS2 transitions from a low logic level to a high logic level, and may change the second node N2 to a low logic level when the second main driving signal MDS2 transitions from a high logic level to a low logic level.

The cross-coupled inverter 130 may be coupled between the first node N1 and the second node N2. The cross-coupled inverter 130 may drive a voltage level of the second node N2 to a complementary voltage level of a voltage level of the first node N1 based on a voltage level of the first node N1, and may drive a voltage level of the first node N1 to a complementary voltage level of a voltage level of the second node N2 based on a voltage level of the second node N2. The cross-coupled inverter 130 may maintain the voltage levels of the first and second nodes N1, N2 when the voltage levels of the first and second nodes N1, N2 are varied by the first and second capacitors 121, 122. For example, when the first node N1 has transitioned from a low logic level to a high logic level by the first main driving signal MDS1 and the first capacitor 121, the voltage level of the first node N1 can be maintained at the high logic level until the first node N1 is transitioned from the high logic level to the low logic level by the first main driving signal MDS1 and the first capacitor 121. Similarly, when the second node N2 has transitioned from a high logic level to a low logic level by the second main driving signal MDS2 and the second capacitor 122, the voltage level of the second node N2 may be maintained at a low logic level until the second node N2 is transitioned from a low logic level to a high logic level by the second main driving signal MDS2 and the second capacitor 122.

The cross-coupled inverter 130 may be operable by receiving the second high power supply voltage VH2 and the second low power supply voltage VL2. The cross-coupled inverter 130 may include a first inverter 131 and a second inverter 132. An input terminal of the first inverter 131 may be coupled with the first node N1, and an output terminal of the first inverter 131 may be coupled with the second node N2. An input terminal of the second inverter 132 is coupled with the second node N2 and an output terminal of the first inverter 131, and an output terminal of the second inverter 132 may be coupled with the first node N1 and an input terminal of the first inverter 131.

The first buffer circuit 110 may further operate by receiving the second high power supply voltage VH2 and the second low power supply voltage VL2. The first buffer circuit 110 may further generate a first auxiliary driving signal SDS1 and a second auxiliary driving signal SDS2. The first buffer circuit 110 may provide the first auxiliary driving signal SDS1 to the first node N1 and the second auxiliary driving signal SDS2 to the second node N2. In one embodiment, the first buffer circuit 110 may generate the first and second auxiliary driving signals SDS1, SDS2 based on the second high power supply voltage VH2 and the second low power supply voltage VL1.

The first buffer circuit 110 may generate the first and second auxiliary driving signals SDS1, SDS2 having a voltage level between the second high power supply voltage VH2 and the second low power supply voltage VL2. The first and second auxiliary driving signals SDS1, SDS2 may have a common mode voltage level. The first buffer circuit 110 may provide the first and second auxiliary driving signals SDS1, SDS2 having the common mode voltage levels to the first and second nodes N1, N2 to compensate for the occurrence of a duty error between the first and second nodes N1, N2. If a difference exists between a common mode voltage level of the first input signal IN1 and a common mode voltage level of the second input signal IN2, a duty cycle difference may occur between the signals of the first node N1 and the second node N2. For example, when the common mode voltage level of the first input signal IN1 is higher than the common mode voltage level of the second input signal IN2, the signal of the first node N1 may have a relatively large duty ratio and the signal of the second node N2 may have a relatively small duty ratio. The first buffer circuit 110 provides the first and second auxiliary driving signals SDS1, SDS2 to the first and second nodes N1, N2 to drive the first and second nodes N1, N2 to a voltage level intermediate between the second high power supply voltage VH2 and the second low power supply voltage VL2, compensating for the difference in common mode voltage levels of the first and second input signals IN1, IN2 and mitigating the duty error of the signals of the first and second nodes N1, N2.

In one embodiment, the first buffer circuit 110 may further generate a first auxiliary driving signal SDS1 and a second auxiliary driving signal SDS2 based on the first and second input signals IN1, IN2. The first buffer circuit 110 may drive the first input signal IN1 with the second high power supply voltage VH2 and the second low power supply voltage VL2 to generate the first auxiliary driving signal SDS1. The first buffer circuit 110 may drive the second input signal IN2 with the second high power supply voltage VH2 and the second low power supply voltage VL2 to generate the second auxiliary driving signal SDS2.

The second buffer circuit 140 may be coupled with the first and second nodes N1, N2 to receive signals of the first and second nodes N1, N2. The second buffer circuit 140 may operate by receiving the second high power supply voltage VH2 and the second low power supply voltage VL2. The second buffer circuit 140 may drive a signal of the first node N1 with the second high power supply voltage VH2 and the second low power supply voltage VL2 to generate the first output signal OUT1. The second buffer circuit 140 may drive the signal of the second node N2 with the second high power supply voltage VH2 and the second low power supply voltage VL2 to generate the second output signal OUT2.

The second buffer circuit 140 may compensate for phase skew and/or duty errors of the signals of the first and second nodes N1, N2. To compensate for the phase skew and/or duty error, the second buffer circuit 140 may delay the signal of the first node N1 and change the voltage level of the second output signal OUT2 based on the delayed signal of the first node N1. The second buffer circuit 140 may delay the signal of the second node N2 and change the voltage level of the first output signal OUT1 based on the delayed signal of the second node N2. By delaying the signal of the first node N1 and mixing the phase of the delayed signal of the first node with the phase of the second output signal OUT2, the second buffer circuit 140 may reduce the phase skew and/or duty error between the signals of the first and second nodes N1, N2 to generate the first and second output signals OUT1, OUT2. The second buffer circuit 140 may delay the signal of the second node N2 and mix the phase of the delayed signal of the second node with the phase of the first output signal OUT1, thereby reducing the phase skew and/or duty error between the signals of the first and second nodes N2 to generate the first and second output signals OUT1, OUT2.

The second buffer circuit may further compensate for a duty ratio between the signals of the first and second nodes N1, N2 and/or the first and second output signals OUT1, OUT2. To compensate for the duty ratio, the second buffer circuit 140 may selectively form a current path between the first output signal OUT1 and the first node N1. Further, the second buffer circuit 140 may selectively form a current path between the second output signal OUT2 and the second node N2.

The level shifter 100 may further comprise a first input buffer 151, a second input buffer 152, a first output buffer 161, and a second output buffer 162. The first and second input buffers 151, 152 may be operable by each receiving the first high power supply voltage VH1 and the first low power supply voltage VL1. The first and second output buffers 161, 162 may be operable by each receiving the second high power supply voltage VH2 and the second low power supply voltage VL2. The first input buffer 151 may receive the first input signal IN1, and may buffer the first input signal IN1. The first input buffer 151 may provide the buffered first input signal IN1 to the first buffer circuit 110. The second input buffer 152 may receive the second input signal IN2, and may buffer the second input signal IN2. The second input buffer 152 may provide the buffered second input signal IN2 to the first buffer circuit 110. The first output buffer 161 may be coupled with the second buffer circuit 140 to receive the first output signal OUT1. The first output buffer 161 may buffer the first output signal OUT1 to output a buffered first output signal OUT1. The second output buffer 162 may be coupled with the second buffer circuit 140 to receive the second output signal OUT2. The second output buffer 140 may buffer the second output signal OUT2 to output a buffered second output signal OUT2.

Figure 2:
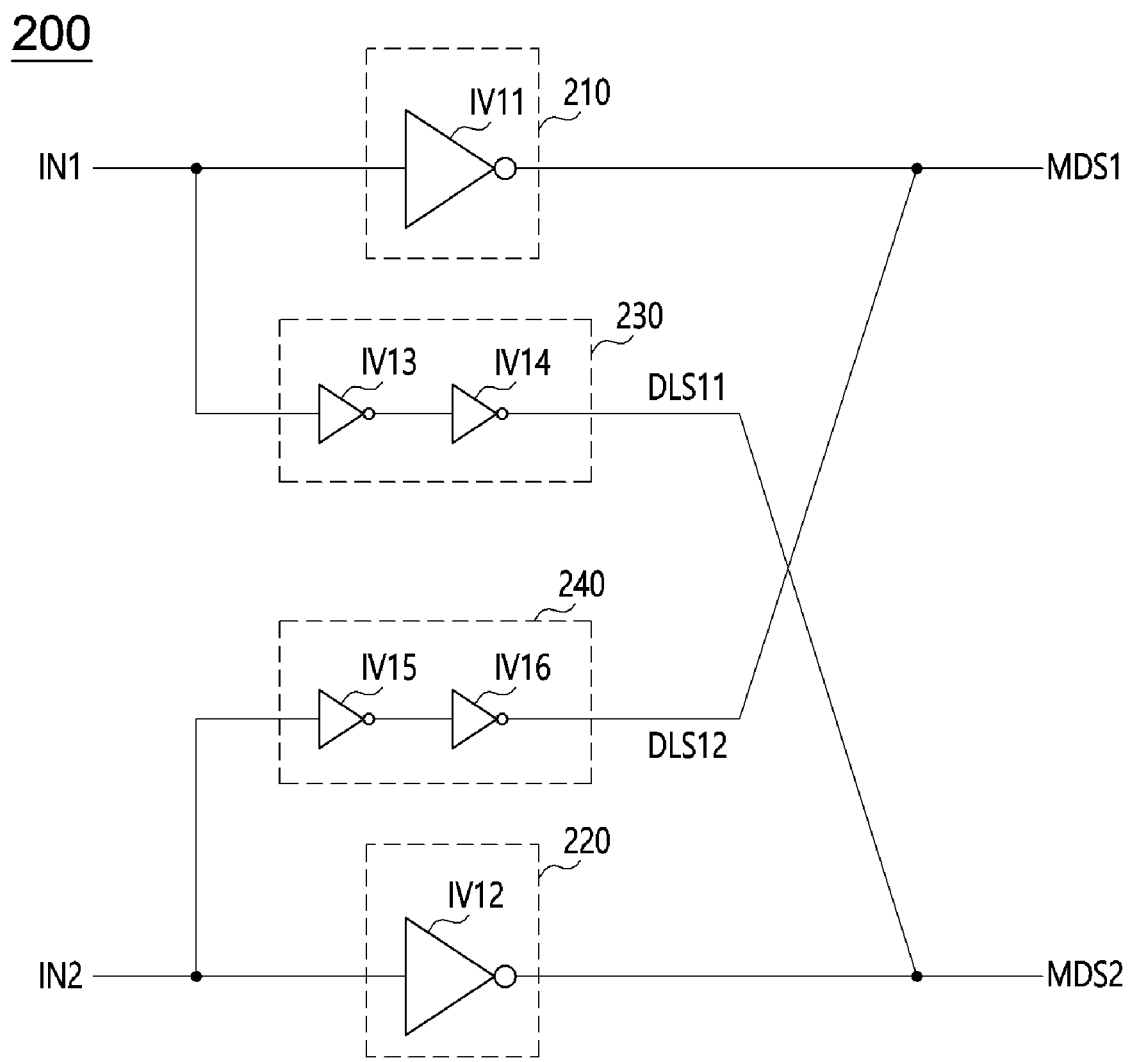
FIG. 2 is a diagram illustrating a configuration of a first buffer circuit according to an embodiment.

FIG. 2 is a diagram illustrating the configuration of a first buffer circuit 200 according to an embodiment. The first buffer circuit 200 may be applied as the first buffer circuit 110 shown in FIG. 1. Referring to FIG. 2, the first buffer circuit 200 may include a first driver 210, a second driver 220, a first delay circuit 230, and a second delay circuit 240. The first driver 210, the second driver 220, the first delay circuit 230, and the second delay circuit 240 may operate by receiving the first high power supply voltage VH1 and the first low power supply voltage VL1 shown in FIG. 1. The first driver 210 may receive the first input signal IN1 to generate the first main driving signal MDS1. The first driver 210 may drive the first input signal IN1 with the first high power supply voltage VH1 and the first low power supply voltage VL1 to generate the first main driving signal MDS1. The second driver 220 may receive the second input signal IN2 to generate the second main driving signal MDS2. The second driver 220 may drive the second input signal IN2 with the first high power supply voltage VH1 and the first low power supply voltage VL1 to generate the second main driving signal MDS2. The first delay circuit 230 may receive the first input signal IN1, and may delay the first input signal IN1 to generate a first delay signal DLS11. The first delay circuit 230 may couple the first delay signal DLS11 with the second main driving signal MDS2, thereby mixing the phases of the first delay signal DLS11 and the second main driving signal MDS2. The second delay circuit 240 may receive the second input signal IN2, and may delay the second input signal IN2 to generate the second delay signal DLS12. The second delay circuit 240 may couple the second delay signal DLS12 with the first main driving signal MDS1, thereby mixing the phase of the second delay signal DLS12 and the first main driving signal MDS1.

The first driver 210 may comprise a first inverter IV11. The first inverter IV11 may generate the first main driving signal MDS1 by inverting the first input signal IN1. An input terminal of the first inverter IV11 may receive the first input signal IN1, and an output terminal of the first inverter IV11 may output the first main driving signal MDS1. The second driver 220 may comprise a second inverter IV12. The driving power of the second inverter IV12 may be substantially the same as the driving power of the first inverter IV11. The second inverter IV12 may drive the second input signal IN2 in reverse to generate the second main driving signal MDS2. An input terminal of the second inverter IV12 may receive the second input signal IN2, and an output terminal of the second inverter IV12 may output the second main driving signal MDS2.

The first delay circuit 230 may include a third inverter IV13 and a fourth inverter IV14. The third and fourth inverters IV13, IV14 may have a smaller driving power than the first inverter IV11. In one embodiment, the sum of the driving powers of the third and fourth inverters IV13. IV14 may be substantially equal to the driving power of the first inverter IV11. The third inverter IV13 may drive the first input signal IN1 in reverse. The fourth inverter IV14 may drive the output signal of the third inverter IV13 in reverse to output the first delay signal DLS11. An input terminal of the third inverter IV13 may receive the first input signal IN1, and an output terminal of the third inverter IV13 may be coupled to an input terminal of the fourth inverter IV14. The output terminal of the fourth inverter IV14 may be coupled with the second main driving signal MDS2.

The second delay circuit 240 may include a fifth inverter IV15 and a sixth inverter IV16. The fifth and sixth inverters IV15, IV16 may have a smaller driving power than the second inverter IV12. In one embodiment, the sum of the driving powers of the fifth and sixth inverters IV15, IV16 may be substantially equal to the driving power of the second inverter IV12. The fifth inverter IV15 may drive the second input signal IN2 in reverse. The sixth inverter IV16 may output the second delay signal DLS12 by driving the output signal of the fifth inverter IV15 in reverse. An input terminal of the fifth inverter IV15 may receive the second input signal IN2, and an output terminal of the fifth inverter IV15 may be coupled to an input terminal of the sixth inverter IV16. The output terminal of the sixth inverter IV16 may be coupled with the first main driving signal MDS1.

When there is a phase skew between the first and second input signals IN1, IN2, the timing at which the first input signal IN1 is input may be t1, and the timing at which the second input signal IN2 is input may be t1+Δts. Here, Δts may be a time corresponding to a phase skew between the first and second input signals IN1, IN2. When the delay time by the first and second inverters IV11, IV12 is Δt2, and the delay time by the third and fourth inverters IV13, IV14 and the delay time by the fifth and sixth inverters IV15, IV16 is Δt3, the timing tMDS1 at which the first main driving signal MDS1 is generated may be defined as shown in Equation 1.

$$tMDS1 = \{(t1 + \Delta t2) + (t1 + \Delta ts + \Delta t3)\}/2 \qquad \text{[Equation 1]}$$

The timing tMDS2 at which the second main driving signal MDS2 is generated may be defined as in Equation 2.

$$tMDS2 = \{(t1 + \Delta ts + \Delta t2) + (t1 + \Delta t3)\}/2 \qquad \text{[Equation 2]}$$

By providing the first buffer circuit 200 with the first and second delay circuits 230, 240, the first buffer circuit 200 can make the timing at which the first main driving signal MDS1 is generated and the timing at which the second main driving signal MDS2 is generated substantially the same, and can compensate for the phase skew between the first and second input signals IN1, IN2.

Figure 3:
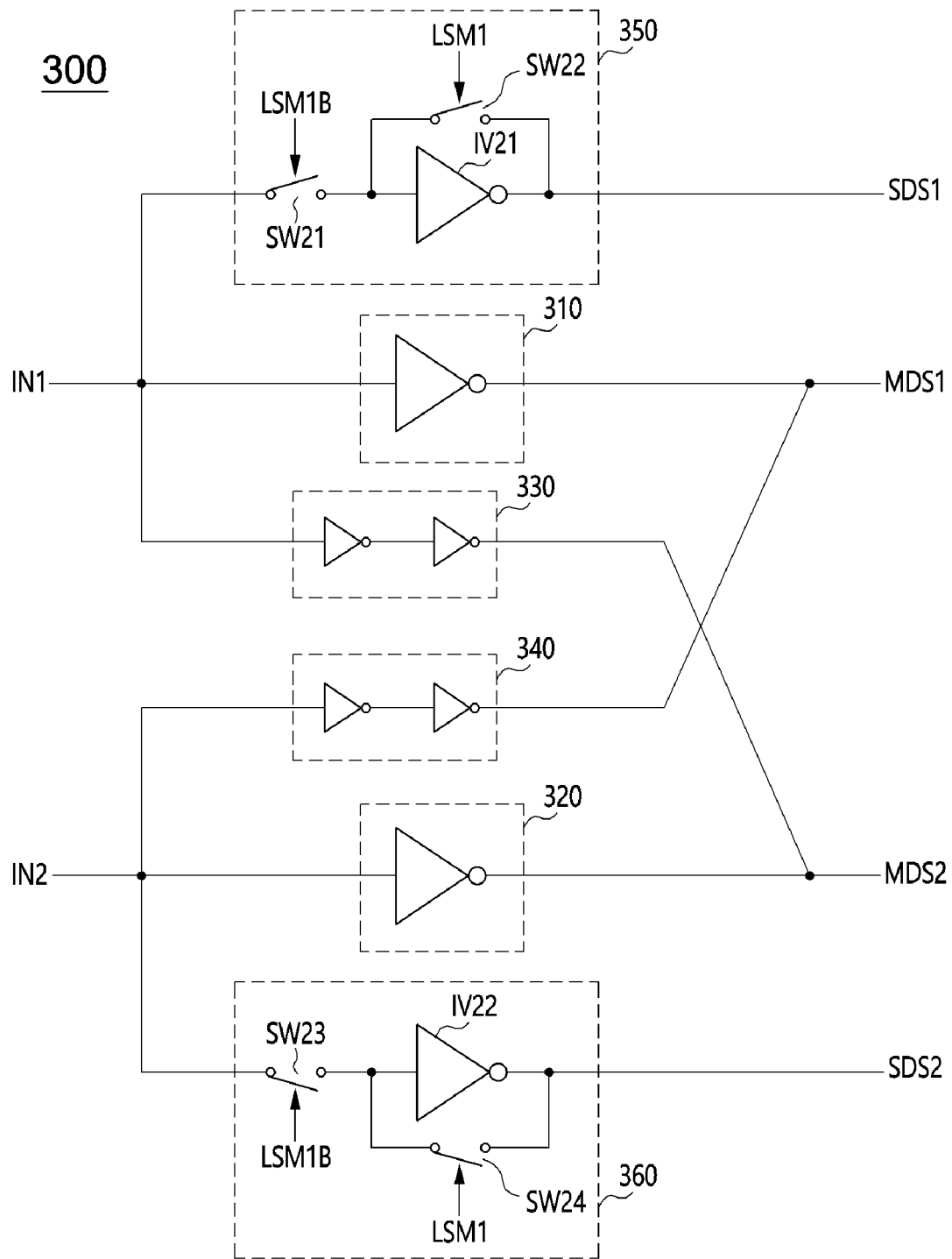
FIG. 3 is a diagram illustrating a configuration of a first buffer circuit according to an embodiment.

FIG. 3 is a diagram illustrating the configuration of a first buffer circuit 300 according to an embodiment. The first buffer circuit 300 may be applied as the first buffer circuit 110 shown in FIG. 1. Referring to FIG. 3, the first buffer circuit 300 may include a first driver 310, a second driver 320, a first delay circuit 330, a second delay circuit 340, a third driver 350, and a fourth driver 360. The first buffer circuit 300 may further include the third and fourth drivers 350, 360 compared to the first buffer circuit 200 illustrated in FIG. 2. The first driver 310, the second driver 320, the first delay circuit 330, and the second delay circuit 340 may be substantially the same as the first driver 210, the second driver 220, the first delay circuit 230, and the second delay circuit 240 shown in FIG. 1, and redundant descriptions of the same components will be omitted.

The third driver 350 may be operable by receiving the second high power supply voltage VH2 and the second low power supply voltage VL2 shown in FIG. 1. In a first operation mode, the third driver 350 may generate the first auxiliary driving signal SDS1 having a voltage level between the second high power supply voltage VH2 and the second low power supply voltage VL2. In the first operation mode, the input terminal of the third driver 350 is coupled with an output terminal of the third driver 350, and the first auxiliary driving signal SDS1 may be output from the output terminal of the third driver 350. In a second operation mode, the third driver 350 may receive the first input signal IN1, and may drive the first input signal IN1 with the second high power supply voltage VH2 and the second low power supply voltage VL2 to generate the first auxiliary driving signal SDS1. The fourth driver 360 may be operated by receiving the second high power supply voltage VH2 and the second low power supply voltage VL2. In the first operation mode, the fourth driver 360 may generate the second auxiliary driving signal SDS2 having a voltage level between the second high power supply voltage VH2 and the second low power supply voltage VL2. In the first operation mode, the input terminal of the fourth driver 360 may be coupled with an output terminal of the fourth driver 360, and the second auxiliary driving signal SDS2 may be output from the output terminal of the fourth driver 360. In the second operation mode, the fourth driver 360 may receive the second input signal IN2, and may drive the second input signal IN2 with the second high power supply voltage VH2 and the second low power supply voltage VL2 to generate the second auxiliary driving signal SDS2.

The third driver 350 may include a first switch SW21, a first inverter IV21, and a second switch SW22. The first switch SW21 may selectively provide the first input signal IN1 to the first inverter IV21 based on an operation mode signal LSM1. The operation mode signal LSM1 may be a signal for specifying the first and second operation modes. In the first operation mode, the operation mode signal LSM1 may be enabled, and in the second operation mode, the operation mode signal LSM1 may be disabled. The first switch SW21 may receive a complementary signal of the operation mode signal LSM1B as a switching control signal. A first end of the first switch SW21 may receive the first input signal IN1, and a second end of the first switch SW21 may be coupled with an input terminal of the first inverter IV21.

When the operation mode signal LSM1 is enabled and the complementary signal of the operation mode signal LSM1B is disabled, the first switch SW21 is turned off and might not provide the first input signal IN1 to the first inverter IV21. When the operation mode signal LSM1 is disabled and the complementary signal of the operation mode signal LSM1B is enabled, the first switch SW21 may be turned on and the first input signal IN1 may be provided to the first inverter IV21. The input terminal of the first inverter IV21 may be coupled to the other end of the first switch SW21, and the first auxiliary driving signal SDS1 may be output from the output terminal of the first inverter IV21. The second switch SW22 may selectively connect an input terminal of the first inverter IV21 and an output terminal of the first inverter IV21 based on the operation mode signal LSM1. The second switch SW22 may receive the operation mode signal LSM1 as a switching control signal. A first end of the second switch SW22 may be coupled with an output terminal of the first inverter IV21 to receive the first auxiliary driving signal SDS1. The other end of the second switch SW22 may be coupled with the input terminal of the first inverter IV21 and the other end of the first switch SW21. When the operation mode signal LSM1 is enabled, the second switch SW22 is turned on, and an output terminal and an input terminal of the first inverter IV21 may be coupled. When the operation mode signal LSM1 is disabled, the second switch SW22 is turned off, and the output terminal and the input terminal of the first inverter IV21 can be disconnected.

The fourth driver 360 may include a third switch SW23, a second inverter IV22, and a fourth switch SW24. The third switch SW23 may selectively provide the second input signal IN2 to the second inverter IV22 based on the operation mode signal LSM1. The third switch SW23 may receive a complementary signal of the operation mode signal LSM1B as a switching control signal. A first end of the third switch SW23 may receive the second input signal IN2, and the other end of the third switch SW23 may be coupled with an input terminal of the second inverter IV22. When the operation mode signal LSM1 is enabled and the complementary signal of the operation mode signal LSM1B is disabled, the third switch SW23 may be turned off, and the second input signal IN2 might not be provided to the second inverter IV22. When the operation mode signal LSM1 is disabled and the complementary signal of the operation mode signal LSM1B is enabled, the third switch SW23 may be turned on and the second input signal IN2 may be provided to the second inverter IV22. An input terminal of the second inverter IV22 may be coupled to the other end of the third switch SW23, and the second auxiliary driving signal SDS2 may be output from an output terminal of the second inverter IV22. The fourth switch SW24 may selectively connect an input terminal of the second inverter IV22 and an output terminal of the second inverter IV22 based on the operation mode signal LSM1. The fourth switch SW24 may receive the operation mode signal LSM1 as a switching control signal. A first end of the fourth switch SW24 may be coupled with an output terminal of the second inverter IV22 to receive the second auxiliary driving signal SDS2. The other end of the fourth switch SW24 may be coupled with the input terminal of the second inverter IN22 and the other end of the third switch SW23. When the operation mode signal LSM1 is enabled, the fourth switch SW24 is turned on, and an output terminal and an input terminal of the second inverter IV22 may be connected. When the operation mode signal LSM1 is disabled, the fourth switch SW24 is turned off, and the output terminal and the input terminal of the second inverter IV22 can be disconnected.

When the operation mode signal LSM1 is enabled in the first operation mode, the first and third switches SW21, SW23 may be turned off and the second and fourth switches SW22, SW24 may be turned on. The first inverter IV21 might not receive the first input signal IN1, and the input terminal and the output terminal of the first inverter IV21 may be connected to each other. The first inverter IV21 may generate the first auxiliary driving signal SDS1 having a voltage level corresponding to a middle of the second high power supply voltage VH2 and the second low power supply voltage VL2. The second inverter IV22 might not receive the second input signal IN2, and the input terminal and the output terminal of the second inverter IV22 may be connected to each other. The second inverter IV22 may generate the second auxiliary driving signal SDS2 having a voltage level corresponding to a middle of the second high power supply voltage VH2 and the second low power supply voltage VL2. When the operation mode signal LSM1 is disabled in the second operation mode, the first and third switches SW21, SW23 may be turned on and the second and fourth switches SW22, SW24 may be turned off. The first inverter IV21 may receive the first input signal IN1, and may drive the first input signal IN1 with the second high power supply voltage VH2 and the second low power supply voltage VL2 to generate the first auxiliary driving signal SDS1. The second inverter IV22 may receive the second input signal IN2, and may drive the second input signal IN2 with the second high power supply voltage VH2 and the second low power supply voltage VL2 to generate the second auxiliary driving signal SDS2.

Figure 4:
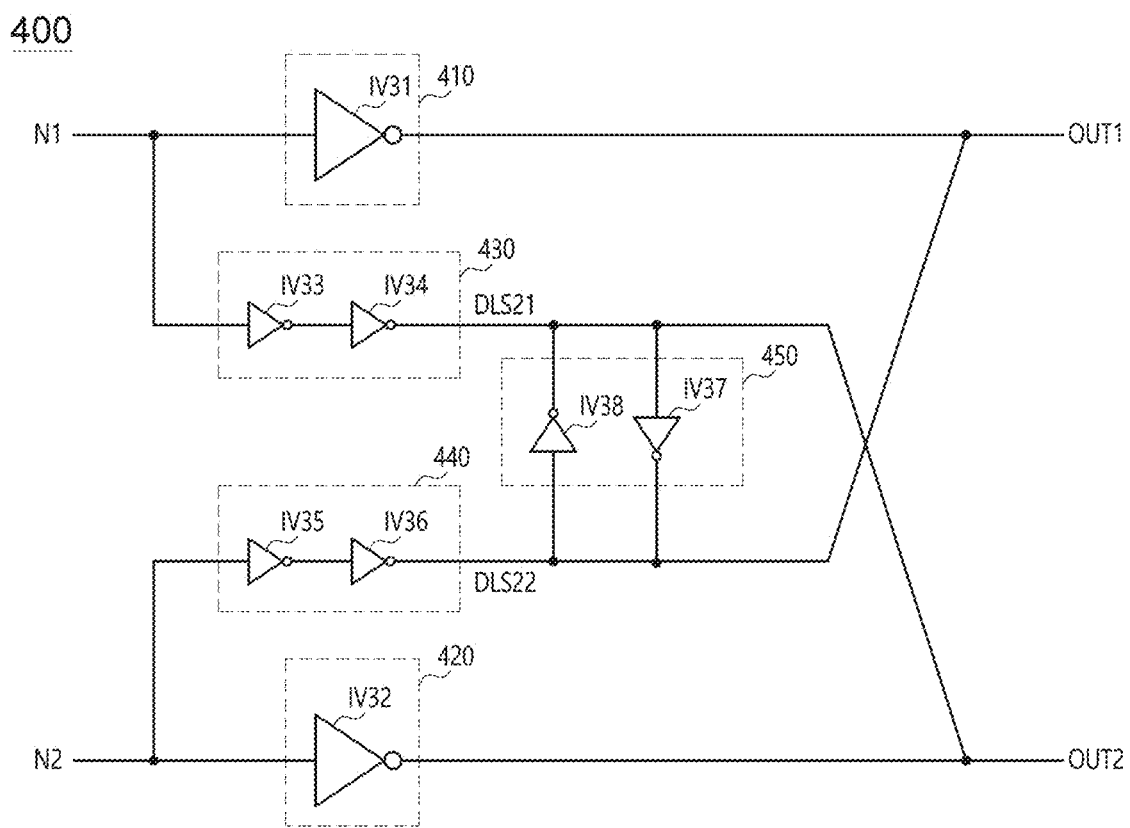
FIG. 4 is a diagram illustrating a configuration of a second buffer circuit according to an embodiment.

FIG. 4 is a diagram illustrating the configuration of a second buffer circuit 400 according to an embodiment. The second buffer circuit 400 may be applied as the second buffer circuit 140 shown in FIG. 1. Referring to FIG. 4, the second buffer circuit 400 may include a first driver 410, a second driver 420, a first delay circuit 430, and a second delay circuit 440. The first driver 410, the second driver 420, the first delay circuit 430, and the second delay circuit 440 may operate by receiving the second high power supply voltage VH2 and the second low power supply voltage VL2 shown in FIG. 1.

The first driver 410 may receive a signal of the first node N1 to generate the first output signal OUT1. The first driver 410 may drive the signal of the first node N1 with the second high power supply voltage VH2 and the second low power supply voltage VL2 to generate the first output signal OUT1. The second driver 420 may receive a signal of the second node N2 to generate the second output signal OUT2. The second driver 420 may drive the signal of the second node N2 with the second high power supply voltage VH2 and the second low power supply voltage VL2 to generate the second output signal OUT2.

The first delay circuit 430 may receive the signal of the first node N1, and may delay the signal of the first node N1 to generate a first delay signal DLS21. The first delay circuit 430 may couple the first delay signal DLS21 with the second output signal OUT2, thereby mixing the phases of the first delay signal DLS21 and the second output signal OUT2. The second delay circuit 440 may receive a signal of the second node N2, and may delay the signal of the second node N2 to generate a second delay signal DLS22. The second delay circuit 440 may couple the second delay signal DLS22 with the first output signal OUT1, and may mix the phases of the second delay signal DLS22 and the first output signal OUT1.

The second buffer circuit 400 may further comprise a latch circuit 450. The latch circuit 450 may be coupled between the first delay circuit 430 and the second delay circuit 440. A first end of the latch circuit 450 may be coupled with the first delay signal DLS21 and the second output signal OUT2, and a second end of the latch circuit 450 may be coupled with the second delay signal DLS22 and the first output signal OUT1. The latch circuit 450 may change the voltage levels of the second delay signal DLS22 and the first output signal OUT1 based on the first delay signal DLS21 and the second output signal OUT2, and may change the voltage levels of the first delay signal DLS21 and the second output signal OUT2 based on the second delay signal DLS22 and the first output signal OUT1. The latch circuit 450 may mix the phases of the first delay signal DLS21 and the second delay signal DLS22 to mitigate the phase skew between the first and second delay signals DLS21, DLS22 and reduce the duty error between the first and second delay signals DLS21, DLS22. Further, the latch circuit 450 may mix the phases of the first output signal OUT1 and the second output signal OUT2 to mitigate the phase skew between the first and second output signals OUT1, OUT2 and reduce the duty error between the first and second output signals OUT1, OUT2.

The first driver 410 may comprise a first inverter IV31. The first inverter IV31 may generate the first output signal OUT1 by invertingly driving the signal of the first node N1. An input terminal of the first inverter IV31 may receive a signal of the first node N1, and an output terminal of the first inverter IV31 may output the first output signal OUT1. The second driver 420 may comprise a second inverter IV32. The driving power of the second inverter IV32 may be substantially the same as the driving power of the first inverter IV31. The second inverter IV32 may generate the second output signal OUT2 by invertingly driving a signal of the second node N2. An input terminal of the second inverter IV32 may receive a signal of the second node N2, and an output terminal of the second inverter IV32 may output the second output signal OUT2.

The first delay circuit 430 may include a third inverter IV33 and a fourth inverter IV34. The third and fourth inverters IV33, IV34 may have a smaller driving power than the first inverter IV31. In one embodiment, the sum of the driving powers of the third and fourth inverters IV33, IV34 may be substantially equal to the driving power of the first inverter IV31. The third inverter IV33 may invertingly drive the signal of the first node N1. The fourth inverter IV34 may output the first delay signal DLS21 by invertingly driving the output signal of the third inverter IV33. An input terminal of the third inverter IV33 may receive a signal of the first node N1, and an output terminal of the third inverter IV33 may be coupled with an input terminal of the fourth inverter IV34. The output terminal of the fourth inverter IV34 may be coupled with the second output signal OUT2.

The second delay circuit 440 may include a fifth inverter IV35 and a sixth inverter IV36. The fifth and sixth inverters IV35, IV36 may have a smaller driving power than the second inverter IV32. In one embodiment, the sum of the driving powers of the fifth and sixth inverters IV35, IV36 may be substantially equal to the driving power of the second inverter IV32. The fifth inverter IV35 may invertingly drive the signal of the second node N2. The sixth inverter IV36 may output the second delay signal DLS22 by invertingly driving the output signal of the fifth inverter IV35. An input terminal of the fifth inverter IV35 may receive a signal of the second node N2, and an output terminal of the fifth inverter IV35 may be coupled with an input terminal of the sixth inverter IV36. The output terminal of the sixth inverter IV36 may be coupled with the first output signal OUT1.

The latch circuit 450 may include a seventh inverter IV37 and an eighth inverter IV38. An input terminal of the seventh inverter IV37 may be coupled with the first delay signal DLS21 and the second output signal OUT2, and an output terminal of the seventh inverter IV37 may be coupled with the second delay signal DLS22 and the first output signal OUT1. The input terminal of the eighth inverter IV38 is coupled to the output terminal of the seventh inverter IV37, and may be coupled to the second delay signal DLS22 and the first output signal OUT1. The output terminal of the eighth inverter IV38 is coupled to the input terminal of the seventh inverter IV37, and may be coupled to the first delay signal DLS21 and the second output signal OUT2.

Figure 5:
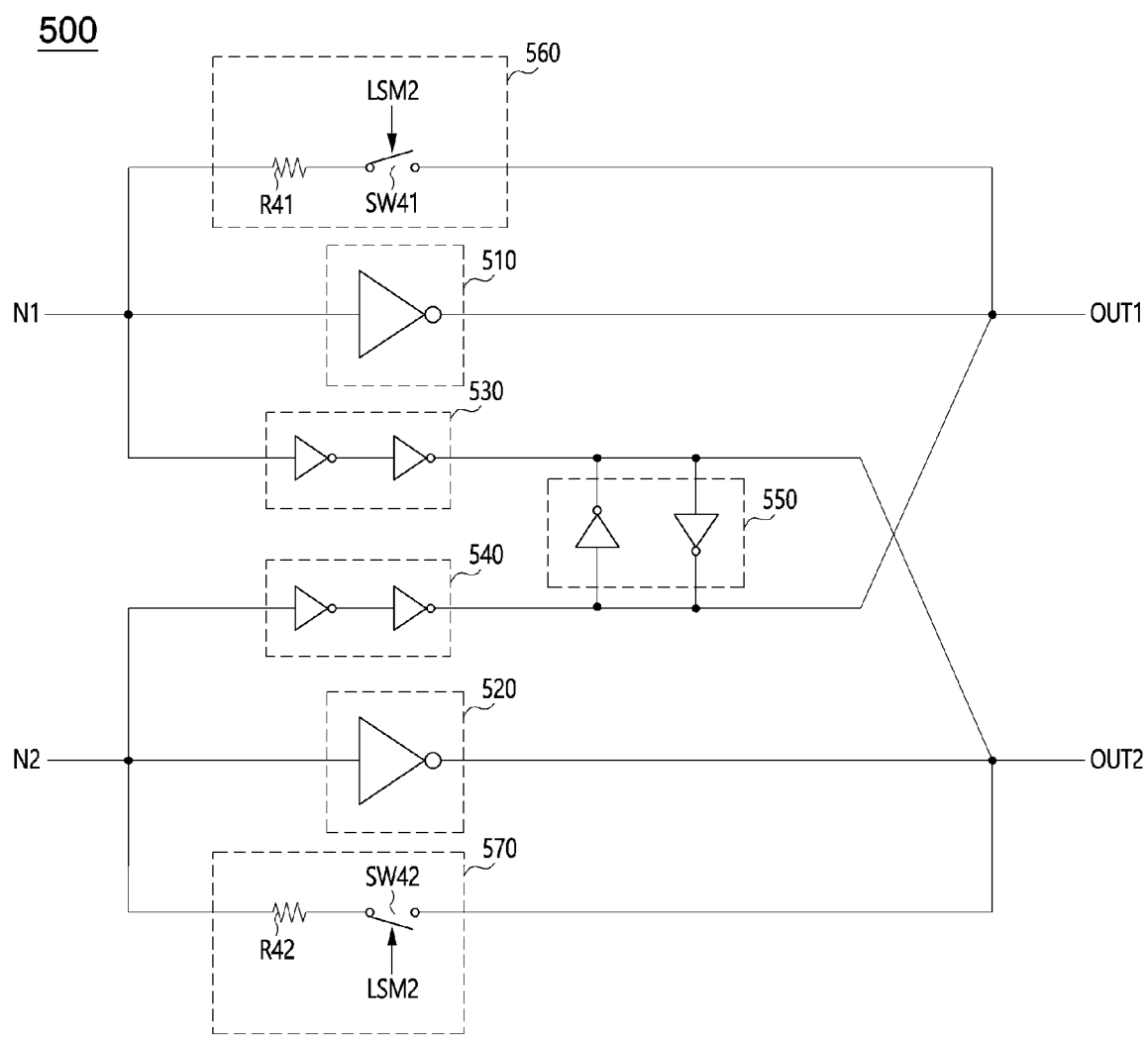
FIG. 5 is a diagram illustrating a configuration of a second buffer circuit according to an embodiment.

FIG. 5 is a diagram illustrating the configuration of a second buffer circuit 500 according to an embodiment. The second buffer circuit 500 may be applied as the second buffer circuit 140 shown in FIG. 1. Referring to FIG. 5, the second buffer circuit 500 may include a first driver 510, a second driver 520, a first delay circuit 530, a second delay circuit 540, a first path circuit 560, and a second path circuit 570. The second buffer circuit 500 may further include a latch circuit 550. The second buffer circuit 500 may further include the first and second path circuits 560, 570 compared to the second buffer circuit 400 illustrated in FIG. 4. The first driver 510, the second driver 520, the first delay circuit 530, the second delay circuit 540, and the latch circuit 550 may be substantially the same as the first driver 410, the second driver 420, the first delay circuit 430, the second delay circuit 440, and the latch circuit 450 shown in FIG. 4, and redundant descriptions of the same components will be omitted.

The first path circuit 560 may selectively provide the first output signal OUT1 to the first node N1 to selectively compensate a duty ratio of the first output signal OUT1. The second path circuit 570 may selectively provide the second output signal OUT2 to the second node N2 to selectively compensate the duty ratio of the second output signal OUT2. The first path circuit 560 may form a current path from the first output signal OUT1 to the first node N1 in a first operation mode. The first path circuit 560 might not form a current path from the first output signal OUT1 to the first node N1 in a second operation mode. The second path circuit 570 may form a current path from the second output signal OUT2 to the second node N2 in the first operation mode. The second path circuit 570 might not form a current path from the second output signal OUT2 to the second node N2 in the second operation mode.

A duty ratio distortion of the first output signal OUT1 may occur when a direct current level of the signal of the first node N1 is higher or lower than a threshold of the inverter comprising the first driver 510. The direct current level of the signal of the first node N1 may mean an average value of a voltage range over which the signal of the first node N1 swings. For example, if the direct current level of the signal of the first node N1 is formed higher than the threshold of the first driver 510, the duty ratio of the first output signal OUT1 may be reduced to less than 50:50 because the low logic level interval of the first output signal OUT1 is longer than the high logic level interval. When the direct current level of the signal of the first node N1 is formed lower than the threshold of the first driver 510, the duty ratio of the first output signal OUT1 may be increased from 50:50 because the high logic level interval of the first output signal OUT1 is longer than the low logic level interval. If the direct current level of the signal of the first node N1 is substantially equal to the threshold of the first driver 510, the duty ratio of the first output signal OUT1 may be maintained at 50:50.

When the direct current level of the first node N1 is higher than the threshold of the first driver 510 and the first path circuit 560 forms a current path from the first output signal OUT1 to the first node N1, current may flow from the first node N1 to the first output signal OUT1, and the direct current level of the first node N1 may be reduced to a voltage level corresponding to the threshold of the first driver 510. Thus, the first path circuit 560 may compensate for the reduction of the duty ratio of the first output signal OUT1 by the direct current level of the signal of the first node N1. When the direct current level of the signal of the first node N1 is lower than the threshold of the first driver 510 and the first path circuit 560 forms a current path from the first output signal OUT1 to the first node N1, a current may flow from the first output signal OUT1 to the first node N1, and a direct current level at the first node N1 may rise to a voltage level corresponding to the threshold of the first driver 510. Thus, the first path circuit 560 may compensate for an increase in the duty ratio of the first output signal OUT1 by the direct current level of the signal of the first node N1.

Similarly, a duty ratio distortion of the second output signal OUT2 may occur when the direct current level of the signal of the second node N2 is higher or lower than the threshold of the inverter comprising the second driver 520. The direct current level of the signal of the second node N2 may mean an average value of a voltage range over which the signal of the second node N2 swings. For example, if the direct current level of the signal of the second node N2 is formed higher than the threshold of the second driver 520, the duty ratio of the second output signal OUT2 may be reduced to less than 50:50 because the low logic level interval of the second output signal OUT2 is longer than the high logic level interval. When the DC level of the signal of the second node N2 is formed lower than the threshold of the second driver 520, the duty ratio of the second output signal OUT2 may be increased from 50:50 because the high logic level interval of the second output signal OUT2 is longer than the low logic level interval. If the direct current level of the signal of the second node N2 is substantially equal to the threshold of the second driver 520, the duty ratio of the second output signal OUT2 may be maintained at 50:50.

When the direct current level of the second node N2 is higher than the threshold of the second driver 520 and the second path circuit 570 forms a current path from the second output signal OUT2 to the second node N2, current may flow from the second node N2 to the second output signal OUT2, and the direct current level of the second node N2 may be reduced to a voltage level corresponding to the threshold of the second driver 520. Thus, the second path circuit 570 may compensate for the reduction of the duty ratio of the second output signal OUT2 by the direct current level of the signal of the second node N2. When the direct current level of the signal of the second node N2 is lower than the threshold of the second driver 520 and the second path circuit 570 forms a current path from the second output signal OUT2 to the second node N2, current may flow from the second output signal OUT2 to the second node N2, and the direct current level of the second node N2 may rise to a voltage level corresponding to the threshold of the second driver 520. Thus, the second path circuit 570 may compensate for an increase in the duty ratio of the second output signal OUT2 by the direct current level of the signal of the second node N2.

The first path circuit 560 may include a first switch SW41 and a first resistor R41. The first switch SW41 may receive an operation mode signal LSM2 as a switching control signal. The operation mode signal LSM2 may be a signal specifying the first operation mode and the second operation mode. In the first operation mode, the operation mode signal LSM2 may be enabled. In the second operation mode, the operation mode signal LSM2 may be disabled. It may be a signal controlled substantially the same as the operation mode signal LSM2 shown in FIG. 4. In one embodiment, the operation mode signal LSM2 may be a signal controlled independently of the operation mode signal LSM1 shown in FIG. 4. A first end of the first switch SW41 may receive the first output signal OUT1, and the other end of the first switch SW41 may be coupled with a first end of the first resistor R41. The other end of the first resistor R41 may be coupled with the first node N1. When the operation mode signal LSM2 is enabled in the first operation mode, the first switch SW41 may be turned on and one end of the first resistor R41 may be coupled with the first output signal OUT1 so that a current path from the first output signal OUT1 to the first node N1 is formed. When the operation mode signal LSM2 is disabled in the second operation mode, the first switch SW41 may be turned off and the current path may be opened.

The second path circuit 570 may include a second switch SW42 and a second resistor R42. The second switch SW42 may receive the operation mode signal LSM2 as a switching control signal. A first end of the second switch SW42 may receive the second output signal OUT2, and a second end of the second switch SW42 may be coupled with a first end of the second resistor R42. The other end of the second resistor R42 may be coupled with the second node N2. When the operation mode signal LSM2 is enabled in the first operation mode, the second switch SW42 may be turned on and one end of the second resistor R42 may receive the second output signal OUT2, and a current path from the second output signal OUT2 to the second node N2 may be formed. When the operation mode signal LSM2 is disabled in the second operation mode, the second switch SW42 may be turned off and the current path may be opened.

Figure 6:
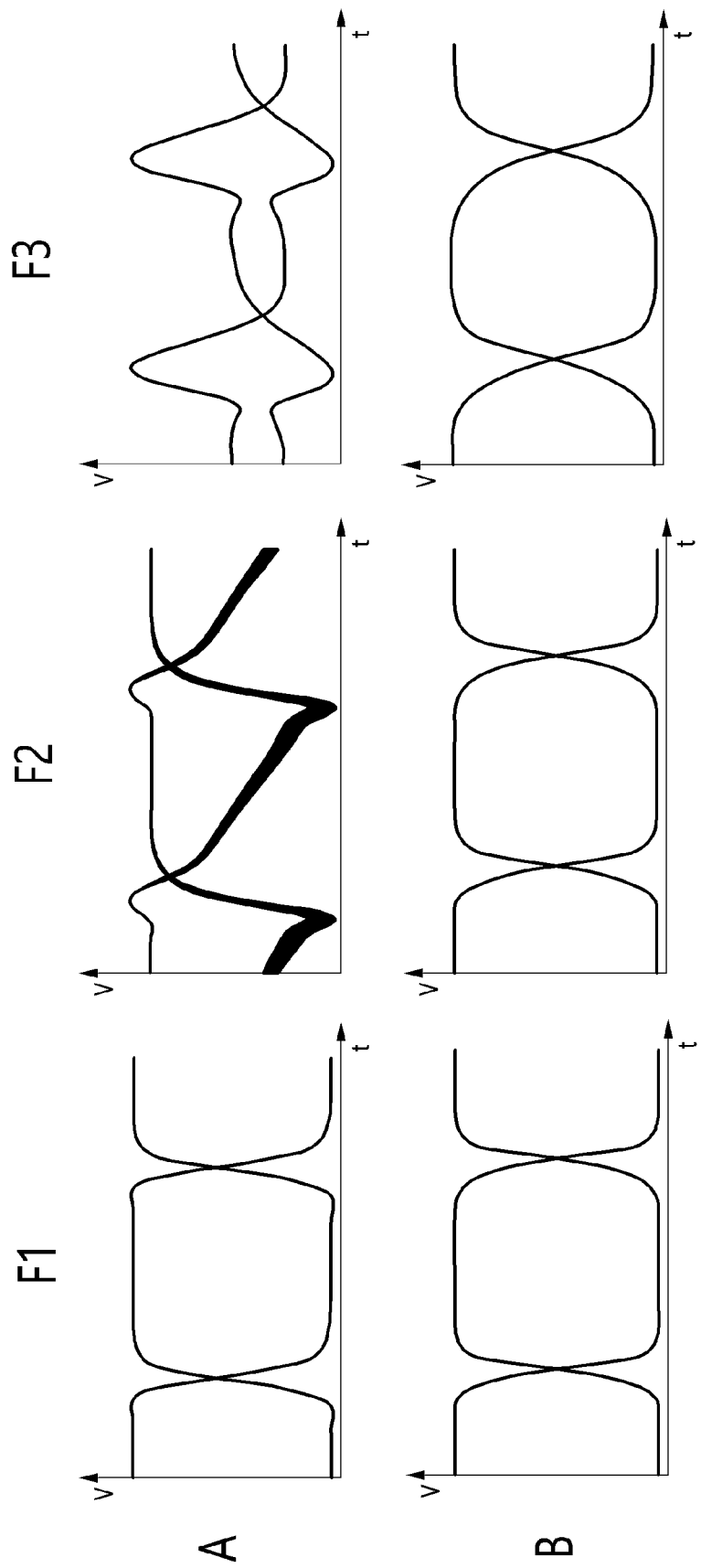
FIG. 6 is a timing diagram showing an operation of a level shifter according to a prior art and a level shifter according to an embodiment.

FIG. 6 is a timing diagram showing the operation of the level shifter according to prior art and the level shifter 100 according to an embodiment when receiving a clock signal. Referring to FIG. 6, A shows a waveform of an output signal generated by a level shifter according to the prior art, and B shows a waveform of an output signal generated by the level shifter 100 according to an embodiment. The graphs on the left side of A and B above may show the waveforms of the output signals when the clock signal has a first frequency F1. The graph in the centre of A and B above may show the waveforms of the output signals when the clock signal has a second frequency F2 higher than the first frequency F1. The graph to the right of A and B above may show the waveforms of the output signals when the clock signal has a third frequency F3 higher than the second frequency F2. In each graph, the horizontal axis represents time t and the vertical axis represents a voltage level V.

When the clock signals are provided as input signals to the level shifter, and the clock signals have a low frequency i.e., a first frequency F1, there might not be a significant difference in the waveforms of the output signals generated from the level shifter according to the prior art and the output signals generated from the level shifter 100 according to the embodiment. Of course, even when the clock signal has a first frequency F1, the output signals generated from the level shifter 100 according to an embodiment may have a wider valid window and/or valid duration than the output signals generated from the level shifter according to the prior art. However, as the frequency of the clock signal increases to the second frequency F2 and the third frequency F3, the waveform of the output signals generated by the level shifter according to the prior art may become increasingly distorted, and the valid window of the output signals may become increasingly reduced. In comparison, the level shifter 100 according to an embodiment can compensate for phase skew and duty errors through the first and second buffer circuits 110, 140, thus preventing distortion of the output signals even as the frequency of the clock signal increases, and securing a sufficiently wide effective window. Thus, the level shifter 100 can reduce malfunctions of an internal circuit receiving the output signals and improve the performance of a semiconductor apparatus having the level shifter 100 and the internal circuit.

Figure 7:
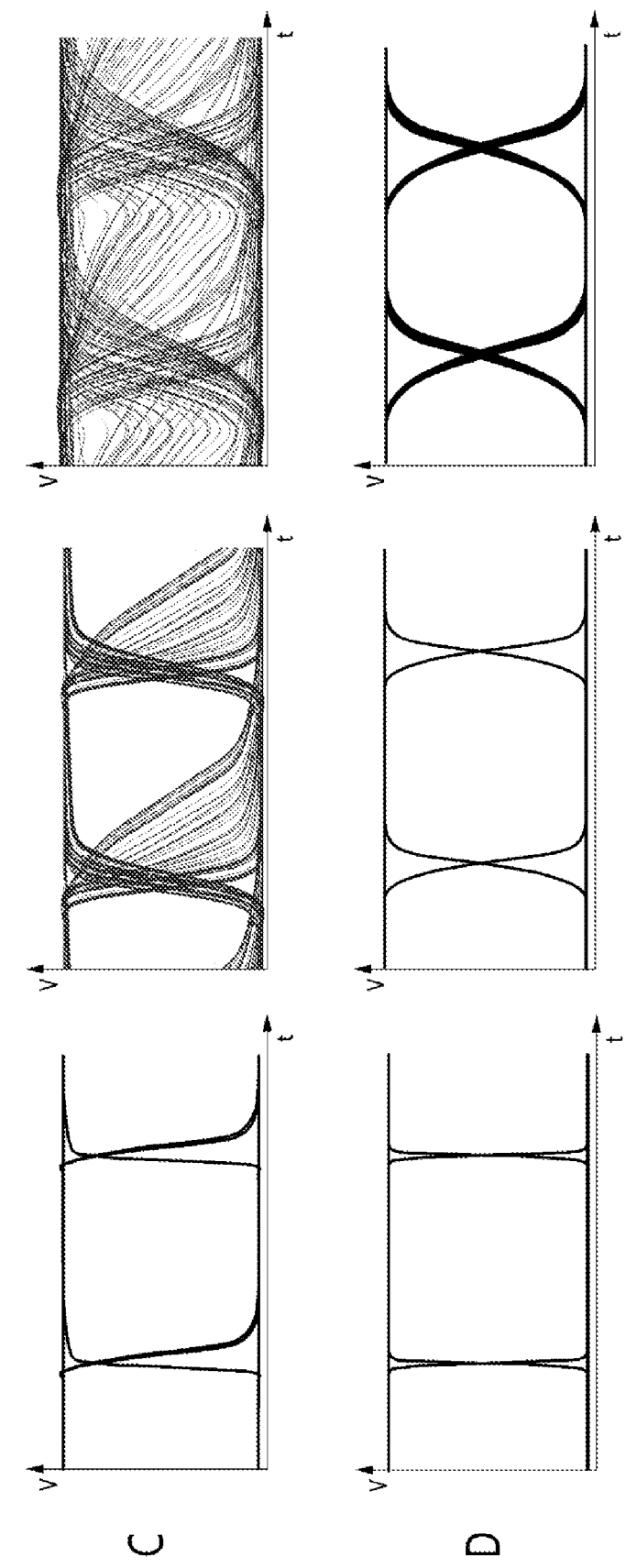
FIG. 7 is a timing diagram showing an operation of a level shifter according to a prior art and a level shifter according to an embodiment when receiving a random bit signal.

FIG. 7 is a timing diagram showing the operation of the level shifter according to prior art and the level shifter 100 according to an embodiment when receiving a random bit signal. Referring to FIG. 7, C shows a waveform of an output signal generated by a level shifter according to the prior art, and D shows a waveform of an output signal generated by the level shifter 100 according to an embodiment. The graphs to the left of C and D may show the waveforms of the output signals when the random bit signal has a first frequency F11. The graph in the centre of C and D above may show the waveforms of the output signals when the random bit signal has a second frequency F12 higher than the first frequency F11. The graph to the right of C and D above may show the waveforms of the output signals when the random bit signal has a third frequency F13 higher than the second frequency F12. In each graph, the horizontal axis represents time t and the vertical axis may represents a voltage level V.

When the random bit signal is provided as an input signal, and the random bit signal has a low frequency i.e., the first frequency F11, there might not be a significant difference in the waveforms of the output signals generated from the level shifter according to the prior art and the output signals generated from the level shifter 100 according to an embodiment. Of course, even when the random bit signal has a first frequency F11, the output signals generated from the level shifter 100 according to an embodiment may have a wider effective window and/or effective duration than the output signals generated from the level shifter according to the prior art. However, as the frequency of the random bit signal increases to the second frequency F12 and the third frequency F13, the waveforms of the output signals generated by the level shifter according to the prior art may become increasingly distorted, and the effective windows of the output signals may become increasingly reduced. In particular, when the random bit signal has the third frequency F13, the output signals generated by the level shifter according to the prior art may be difficult to form an effective window. In comparison, the level shifter 100 according to an embodiment can compensate for phase skew and duty errors through the first and second buffer circuits 110, 140, and thus can prevent distortion of the output signals even when the frequency of the random bit signal increases, and can secure a sufficiently wide effective window. Thus, the level shifter 100 may reduce malfunctions of an internal circuit receiving the output signals and improve the performance of a semiconductor apparatus having the level shifter 100 and the internal circuit.

Figure 8:
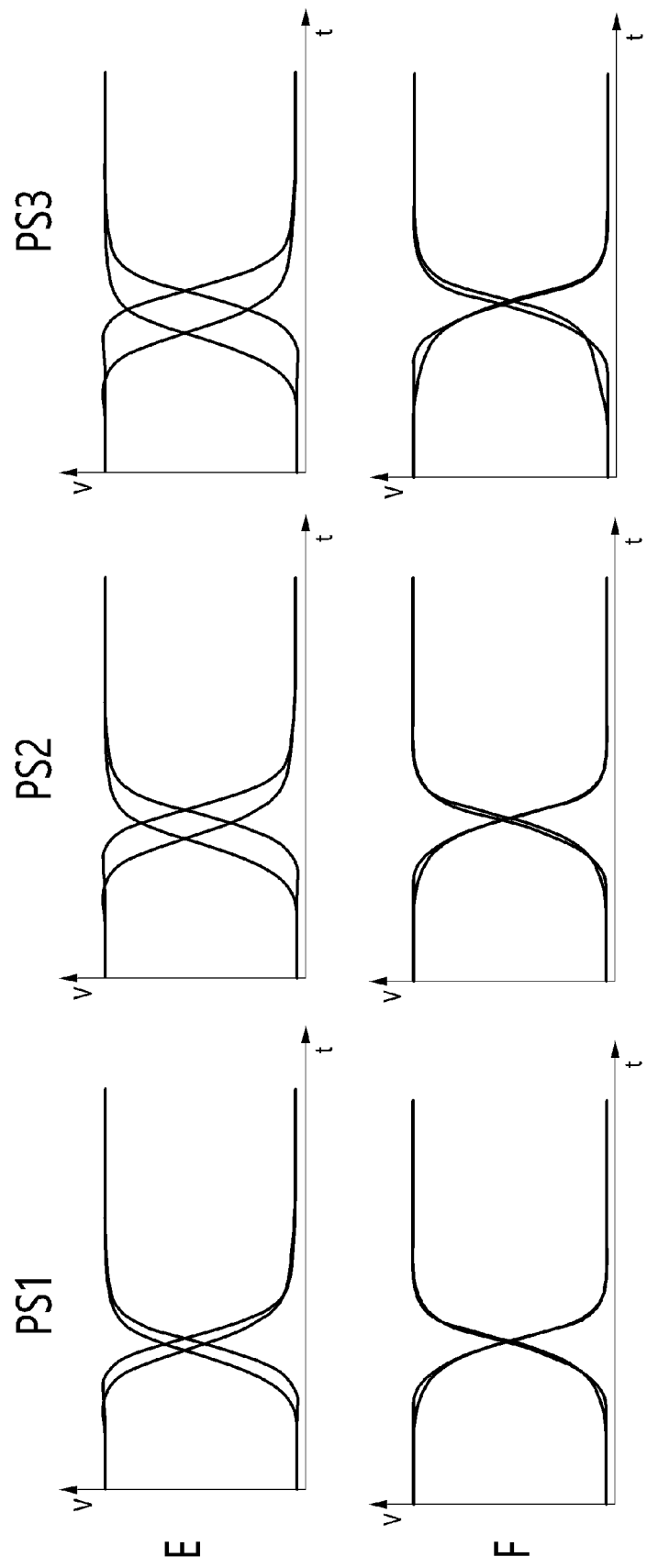
FIG. 8 is a timing diagram showing an operation of a level shifter according to a prior art and a level shifter according to an embodiment when phase skew is present in the input signals.

FIG. 8 is a timing diagram showing the operation of a level shifter according to a prior art and a level shifter 100 according to an embodiment when a phase skew is present in the input signals. Referring to FIG. 8, E shows waveforms of an output signal generated by a level shifter according to the prior art, and F shows waveforms of an output signal generated by the level shifter 100 according to an embodiment. The graphs to the left of E and F may show the waveforms of the output signals when the input signals have a first phase skew PS1. The graph in the centre of E and F may show the waveforms of the output signals when the input signals have a second phase skew PS2 greater than the first phase skew PS1. The graphs to the right of E and F above may show the waveforms of the output signals when the input signals have a third phase skew PS3 greater than the second phase skew PS2. In each graph, the horizontal axis represents time t and the vertical axis represents a voltage level V.

When the phase skew of the input signals becomes larger and larger, the level shifter according to the prior art does not perform an operation to compensate for the phase skew or compensates for the phase skew in a different manner than the embodiment of the present disclosure, so that the output signal generated by the level shifter may have a phase skew that is not significantly different from the phase skew of the input signals. In comparison, the level shifter 100 according to an embodiment of the present disclosure can compensate for phase skew and duty error through the first and second buffer circuits 110, 140, so that the phase skew between the output signals can be almost eliminated when the input signals have first and second phase skew PS1, PS2. Even if the input signals have a third phase skew PS3, the level shifter 100 can significantly reduce the third phase skew PS3 to generate the output signals having a reduced phase skew. Thus, the level shifter 100 may reduce malfunctions of an internal circuit receiving the output signals and improve performance of a semiconductor apparatus having the level shifter 100 and the internal circuit.

While certain embodiments have been described above, it will be understood to those skilled in the art that the embodiments described are by way of example only. Accordingly, the level shifter should not be limited based on the described embodiments. Rather, the level shifter described herein should only be limited in light of the claims that follow when taken in conjunction with the above description and accompanying drawings.

What is claimed is:

1. A level shifter comprising:
a first buffer circuit configured to drive a first input signal and a second input signal with a first high power supply voltage and a first low power supply voltage to generate a first main driving signal and a second main driving signal, respectively, configured to change a voltage level of the second main driving signal based on the first input signal, and configured to change a voltage level of the first main driving signal based on the second input signal;
a first capacitor having a first end for receiving the first main driving signal and a second end being coupled with a first node;
a second capacitor having a first end for receiving the second main driving signal and a second end being coupled with a second node;
a cross-coupled inverter coupled between the first and second nodes, the cross-coupled inverter operable to receive a second high power supply voltage and a second low power supply voltage; and
a second buffer circuit configured to drive signals of the first and second nodes with the second high power supply voltage and the second low power supply voltage to generate a first output signal and a second output signal, respectively.

2. The level shifter of claim 1, wherein the first buffer circuit is configured to provide a first auxiliary driving signal and a second auxiliary driving signal having a voltage level between the second high power supply voltage and the second low power supply voltage to the first and second nodes, respectively.

3. The level shifter of claim 1, wherein the first buffer circuit is configured to drive the first input signal with the second high power supply voltage and the second low power supply voltage to generate a first auxiliary driving signal, configured to drive the second input signal with the second high power supply voltage and the second low power supply voltage to generate a second auxiliary driving signal, configured to provide the first auxiliary driving signal to the first node, and configured to provide the second auxiliary driving signal to the second node.

4. The level shifter of claim 1, wherein the first buffer circuit includes:
a first driver configured to drive the first input signal to generate the first main driving signal;
a first delay circuit configured to delay the first input signal to generate a first delay signal, and couple the first delay signal with the second main driving signal;
a second driver configured to drive the second input signal to generate the second main driving signal; and
a second delay circuit configured to the second input signal to generate a second delay signal, and couple the second delay signal with the first main driving signal.

5. The level shifter of claim 4, wherein the first buffer circuit further includes:
a third driver operable to receive the second high power supply voltage and the second low power supply voltage, the third driver having an input terminal and an output terminal coupled to the first node; and
a fourth driver operable to receive the second high power supply voltage and the second low power supply voltage, the fourth driver having an input terminal and an output terminal coupled to the second node.

6. The level shifter of claim 4 wherein the first buffer circuit further includes:
a third driver configured to drive the first input signal with the second high power supply voltage and the second low power supply voltage to generate a first auxiliary driving signal, and configured to provide the first auxiliary driving signal to the first node; and a fourth driver configured to drive the second input signal with the second high power supply voltage and the second low power supply voltage to generate a second auxiliary driving signal, and configured to provide the second auxiliary driving signal to the second node.

7. The level shifter of claim 1, wherein the second buffer circuit is configured to change a voltage level of the second output signal based on the signal of the first node, and configured to change a voltage level of the first output signal based on the signal of the second node.

8. The level shifter of claim 7, wherein the second buffer circuit is configured to change a voltage level of the first node based on the first output signal, and configured to change a voltage level of the second node based on the second output signal.

9. The level shifter of claim 1, wherein the second buffer circuit includes:
a first driver configured to drive the signal of the first node to generate the first output signal;
a first delay circuit configured to delay the signal of the first node to generate a first delay signal, and configured to couple the first delay signal with the second output signal;
a second driver configured to drive the signal of the second node to generate the second output signal; and
a second delay circuit configured to delay the second input signal to generate a second delay signal, and configured to couple the second delay signal with the first output signal.

10. The level shifter of claim 9, wherein the second buffer circuit further includes a latch circuit for mixing phases of the first delay signal and the second delay signal.

11. The level shifter of claim 9, wherein the second buffer circuit further includes:
a first resistor coupled between the first node and the first output signal; and
a second resistor coupled between the second node and the second output signal.

12. A level shifter comprising:
a first buffer circuit configured to drive a first input signal and a second input signal with a first high power supply voltage and a first low power supply voltage to generate a first main driving signal and a second main driving signal;
a first capacitor having a first end for receiving the first main driving signal and a second end being coupled to a first node;
a second capacitor having a first end for receiving the second main driving signal and a second end being coupled with a second node;
a cross-coupled inverter coupled between the first and second nodes, the cross-coupled inverter operable to receive a second high power supply voltage and a second low power supply voltage; and
a second buffer circuit configured to drive signals of the first and second nodes with the second high power supply voltage and the second low power supply voltage to generate a first output signal and a second output signal, respectively, configured to change a voltage level of the second output signal based on a signal of the first node, and configured to change a voltage level of the first output signal based on a signal of the second node.

13. The level shifter of claim 12, wherein the first buffer circuit is configured to change a voltage level of the first main driving signal based on the first input signal, and configured to change a voltage level of the second main driving signal based on the second input signal.

14. The level shifter of claim 12, wherein the first buffer circuit is configured to provide a first auxiliary driving signal and a second auxiliary driving signal having a voltage level between the second high power supply voltage and the second low power supply voltage to the first and second nodes, respectively.

15. The level shifter of claim 12, wherein the first buffer circuit is configured to drive the first input signal with the second high power supply voltage and the second low power supply voltage to generate a first auxiliary driving signal, configured to drive the second input signal with the second high power supply voltage and the second low power supply voltage to generate a second auxiliary driving signal, configured to provide the first auxiliary driving signal to the first node, and configured to provide the second auxiliary driving signal to the second node.

16. The level shifter of claim 12, wherein the second buffer circuit configured to form a first current path coupling between the first output signal and the first node, and to form a second current path coupling between the second output signal and the second node.

17. A level shifter comprising:
a first buffer circuit configured to drive a first input signal and a second input signal with a first high power supply voltage and a first low power supply voltage to generate a first main driving signal and a second main driving signal, respectively, configured to provide a first auxiliary driving signal and a second auxiliary driving signal having a voltage level between a second high power supply voltage and a second low power supply voltage to a first node and a second node, respectively, in a first operation mode, and configured to drive the first and second input signals with the second high power supply voltage and the second low power supply voltage to generate the first and second auxiliary driving signals, respectively, in a second operation mode;
a first capacitor having a first end for receiving the first main driving signal and a second end being coupled with the first node;
a second capacitor having a first end for receiving the second main driving signal and a second end being coupled with the second node;
a cross-coupled inverter coupled between the first and second nodes, the cross-coupled inverter operable to receive the second high power supply voltage and the second low power supply voltage; and
a second buffer circuit configured to drive signals of the first and second nodes with the second high power supply voltage and the second low power supply voltage to generate a first output signal and a second output signal, respectively.

18. The level shifter of claim 17, wherein the first buffer circuit is configured to change a voltage level of the second main driving signal based on the first input signal, and configured to change a voltage level of the first main driving signal based on the second input signal.

19. The level shifter of claim 17, wherein the second buffer circuit is configured to change a voltage level of the second output signal based on the signal of the first node, and configured to change a voltage level of the first output signal based on the signal of the second node.

20. The level shifter of claim 19, wherein the second buffer circuit is configured to form a first current path coupling between the first output signal and the first node, and to form a second current path coupling between the second output signal and the second node.

21. A level shifter comprising:
- a first buffer circuit configured to drive a first input signal and a second input signal with a first high power supply voltage and a first low power supply voltage to generate a first main driving signal and a second main driving signal, respectively;
- a first capacitor having a first end for receiving the first main driving signal and a second end being coupled to a first node;
- a second capacitor having a first end for receiving the second main driving signal and a second end being coupled with a second node;
- a cross-coupled inverter coupled between the first and second nodes, the cross-coupled inverter operable to receive a second high power supply voltage and a second low power supply voltage; and
- a second buffer circuit configured to drive signals of the first and second nodes with the second high power supply voltage and the second low power supply voltage to generate a first output signal and a second output signal, respectively, configured to selectively provide the first output signal to the first node and to selectively provide the second output signal to the second node, based on an operation mode signal.

22. The level shifter of claim 21, wherein the first buffer circuit is configured to change a voltage level of the second main driving signal based on the first input signal, and configured to change a voltage level of the first main driving signal based on the second input signal.

23. The level shifter of claim 21, wherein the first buffer circuit is configured to generate a first auxiliary driving signal and a second auxiliary driving signal having a voltage level between the second high power supply voltage and the second low power supply voltage in the first operation mode, and configured to provide the first and second auxiliary driving signals to the first and second nodes, respectively.

24. The level shifter of claim 21, wherein the first buffer circuit is configured to drive the first and second input signals with the second high power supply voltage and the second low power supply voltage to generate a first auxiliary driving signal and a second auxiliary driving signal in the second operation mode, and configured to provide the first and second auxiliary driving signals to the first and second nodes, respectively.

25. The level shifter of claim 21, wherein the second buffer circuit is configured to change a voltage level of the second output signal based on the signal of the first node, and configured to change a voltage level of the first output signal based on the signal of the second node.

* * * * *